United States Patent
Saccocio

(10) Patent No.: US 6,175,088 B1
(45) Date of Patent: Jan. 16, 2001

(54) MULTI-LAYER PRINTED-WIRING BOARDS WITH INNER POWER AND GROUND LAYERS

(75) Inventor: Sean M. Saccocio, Gahanna, OH (US)

(73) Assignee: Avaya Technology Corp., Miami Lakes, FL (US)

(*) Notice: Under 35 U.S.C. 154(b), the term of this patent shall be extended for 0 days.

(21) Appl. No.: 09/166,828

(22) Filed: Oct. 5, 1998

(51) Int. Cl.[7] .................................................. H01R 9/09
(52) U.S. Cl. ........................ 174/262; 174/255; 361/780; 361/794
(58) Field of Search ................................. 174/262, 263, 174/264, 265, 266, 255; 361/794, 793, 795, 780

(56) References Cited

U.S. PATENT DOCUMENTS

| | | | |
|---|---|---|---|
| 4,642,160 | * | 2/1987 | Burgess .............................. 156/630 |
| 4,984,132 | * | 1/1991 | Sakurai et al. ....................... 361/794 |
| 5,048,166 | * | 9/1991 | Wakamatsu ........................... 29/830 |
| 5,450,290 | * | 9/1995 | Boyko et al. ......................... 361/792 |
| 5,451,721 | * | 9/1995 | Tsukada et al. ...................... 174/261 |
| 5,495,665 | * | 3/1996 | Carpenter et al. ..................... 29/830 |
| 5,583,321 | * | 12/1996 | DiStefano ........................... 174/264 |
| 5,726,863 | * | 3/1998 | Nakayama et al. .................... 361/794 |

* cited by examiner

Primary Examiner—Jeffrey Gaffin
Assistant Examiner—Kamand Cuneo
(74) Attorney, Agent, or Firm—David Volejnicek

(57) ABSTRACT

In a multi-layer printed-wiring board (100) the ground and power conductor-bearing layers (102 and 103) are placed immediately (without intermediacy of other conductive layers) below the outer surface conductor-bearing layers (101) and are connected to the outer surface layers by micro-vias (110 and 111) that do not extend beyond the ground and power layers, whereby the micro-vias avoid causing trace-routing blockages on lower, signal-routing, layers (104). The surface layers define traces for static and infrequently-changing signals. One or both of the ground and power layers define double pads (203) each comprising a pair of normal pads (204–205) interconnected by a short trace (206). One single pad of each pair is connected by a micro-via to a corresponding pad (202) on an outer surface layer, which also typically has a lead (201) of a component (200) soldered thereto or serves as a testpad. The other single pad of each pair is connected by a buried through-hole via (207) to pads (208) on the lower, signal-routing, layers. This removes the double pads from the outer surface layer and thus reduces trace-routing blockages on the outer surface layer, and at the same time solves the problem of connecting micro-vias to through-hole vias.

14 Claims, 1 Drawing Sheet

MULTI-LAYER PRINTED-WIRING BOARDS WITH INNER POWER AND GROUND LAYERS

TECHNICAL FIELD

This invention relates to the configuration of multi-layer printed-wiring boards (PWBs), also known as printed-circuit (PC) boards.

BACKGROUND OF THE INVENTION

The problem of routing conductive traces in densely-packed PWBs has been at the forefront of electronics circuit design and manufacture for decades. On multi-layer PWBs, most of the traces lie on between the internal conductive layers of the PWB. In order to effect connections between the conductive layers, conductive vias are required. Vias have traditionally been formed as through-hole vias: by drilling holes through the entire PWB after the multiple layers have been assembled and then plating the holes with a conductive material, such as copper, so as to connect traces or solder pads on one layer to those on another one or more layers. During the PWB design process, as more and more vias are placed on the PWB, the task of routing the traces on the various conductive layers becomes more and more difficult, because the vias represent blockages for traces that do not connect to them. The recent introduction of ball-grid array (BGA) devices, whose "pins" (solder balls) are arranged in a tightly-packed two-dimensional array, exacerbate this routing problem, because the density of the "pin" array creates a virtual "bed-of-nails" via structure within the PWB. Such a large number of obstructions can make the routing problem virtually impossible to solve.

Recently, a significant improvement in via technology has been introduced, called micro-via. Micro-vias are very small blind vias. A blind via is one that extends from a surface of the completed PWB to one of the interior conductive layers of the PWB. The holes for micro-vias are typically laser-drilled for precision and for lower cost. Such micro-vias do not create blockages on PWB layers to/through which they do not extend. Nevertheless, they create as much of an obstruction in the layers through which they do extend as the through-hole vias.

Blind vias can be created by controlling drill depth or by drilling a laminated sub-component of a multi-layer PWB prior to final lamination. The latter adds cost to the assembly process and does not afford the opportunity to connect buried vias to blind vias. The former technique has been viable with mechanical drills, but only for relatively large-dimensioned PWB designs, due to loose mechanical tolerances.

Vias, whether through-hole or blind, generally attach to a layer at a pad, as do the contacts ("pins") of components at the outer surface layers of the PWB. However, if the contact of a component is attached to the same pad as a via, there is the danger—which increases with the diameter of the via—that the via will wick the solder away from the contact and thereby cause an unreliable connection. For this reason, separate pads have generally been used on the outer surface layers of the PWB for attaching vias and for attaching component contacts. But, like the vias, the additional pads create routing blockages on the surface layers of the PWB and they limit the number of connections that can be made to, and hence the number of components that can be mounted on, the PWB. It is therefore desirable to put vias in the component pads, if the solder-wicking problem can be overcome, so as to allow additional trace routing on the outer surface layers.

SUMMARY OF THE INVENTION

This invention is directed to solving these and other problems and disadvantages of the prior art. Generally according to the invention, the inventor has combined the use of micro-vias with carefully-selected placement of power and ground layers within the PWB to minimize the trace-routing blockages caused by vias.

According to one aspect of the invention, in a multi-layer printed-wiring board, the ground layer and the power layer are placed directly adjacent to each other and to the outer surface layer, i.e., without intermediacy of any other conductive layer, and the outer surface layer is conductively connected to the power and ground layers by vias that do not extend to any other conductive layers, e.g., signal-routing inner layers that are placed below the power and ground layers. Thus, the connections between the outer surface layer and the power and ground layers avoid causing trace-routing blockages on the other layers. The printed-wiring board may have components mounted on both outer surfaces (top and bottom), in which case it also has a second ground layer and a second power layer placed directly adjacent to each other and to the second outer surface layer, i.e., without intermediacy of any other conductive layer, and the second outer surface layer is conductively connected to the second power and ground layers by second vias that do not extend to any other conductive layers.

According to another aspect of the invention, in a multi-layer printed-wiring board, a first one (e.g., a power layer and/or a ground layer) of a plurality of inner conductive layers is positioned adjacent to an outer surface layer and defines a plurality of elongated pads that have a first region and a second region separated from the first region. Illustratively, each elongated pad is a double pad that comprises a pair of adjacent and conductively interconnected single pads, with different pads of the pair forming the first and the second regions. The elongated pads correspond to different pads on the outer surface layer, which are for having connections made thereto, e.g., leads of electrical components soldered thereto or test probes contacted therewith. The outer surface layer further defines a plurality of conductive micro-vias, each extending between and connecting a different one of the surface pads to the first region of the corresponding elongated pad. The micro-vias do not extend to inner conductive layers beyond the first inner layer. The inner layers define a plurality of conductive buried vias that extend between and connect the second regions of the elongated pads to signal routing traces on the inner conductive layers. By definition, the buried vias do not extend to the outer surface layer. The use of the micro-vias to connect to the surface pads solves the problem of vias wicking solder away from component leads. The use of the elongated pads solves the problem of connecting micro-vias to through-hole vias (called "the stacked via problem"). And the placement of the elongated pads on one of the first inner conductive layers solves both the problem of the micro-vias having shallow penetration into a board and the trace-routing blockages that would be caused by placement of the elongated pads on the outer surface layer.

These and other features and advantages of the present invention will become more apparent from the following description of an illustrative embodiment of the invention taken together with the drawing.

DETAILED DESCRIPTION

Figure 1:
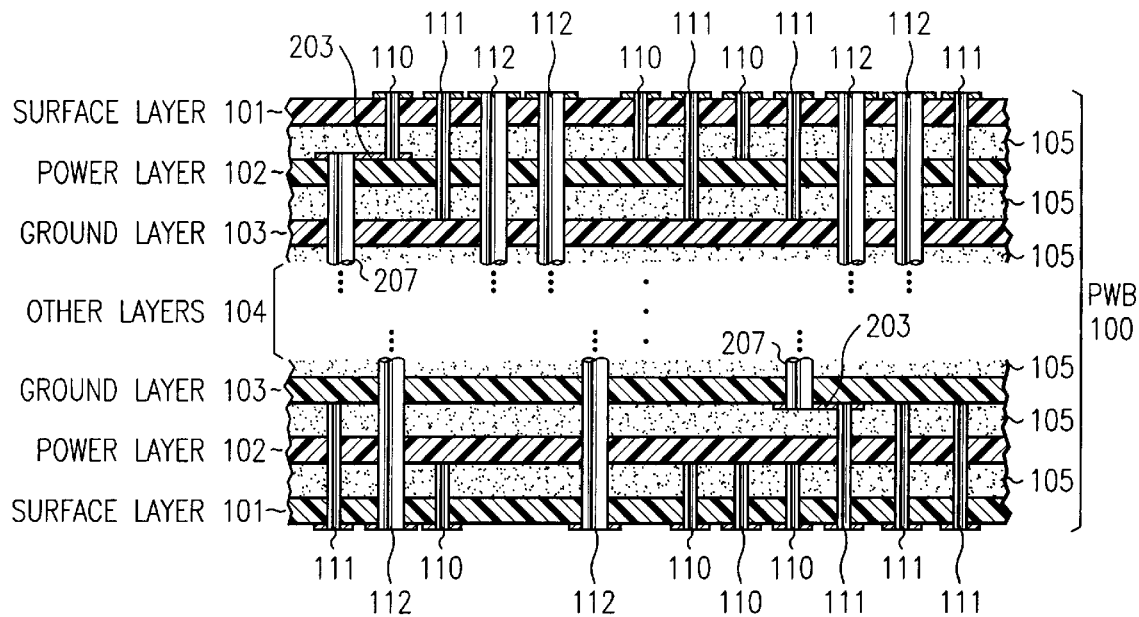
FIG. 1 is a sectional view of a printed-wiring board that includes an illustrative embodiment of the invention.

FIG. 1 shows a representation of a PWB 100 configured according to the invention. PWB 100 is a multi-layer board comprising a plurality of power, ground, and routing (conductor-bearing) layers 101–104 separated from each other by insulating (dielectric) layers 105. The thickness of insulation layers 105 between the power, the ground, and the routing layers 101–104 determines the electrical characteristics of the traces on the routing layers. The identification of power, ground, and routing layers 101–104 is known as a "stackup". Interconnections between power, ground and routing layers 101–104 are effected by vias 110–112—both through-hole vias and blind micro-vias. PWB 100 has electrical components (not shown) mounted on both sides thereof. However, PWB 100 could just as well have components mounted on only one side. As described so far, PWB 100 is conventional.

The inventor has recognized that a relatively-large number of the interconnections made by vias 110–112 normally are made between the outer surface layers 101 and the power and ground layers 102 and 103. According to the invention, therefore, he has placed the power and ground layers 102 and 103 directly beneath—adjacent without intermediacy of other conductive layers to—the surface layers 101, and has interconnected the surface layers 101 with the power and ground layers 102 and 103 by micro-vias 110 and 111, respectively, that generally do not extend into PWB 100 beyond the power and ground layers 102 and 103. (Power layer 102 may actually comprise a plurality of layers, each for distributing different power, e.g., a 5V power layer and a 3V power layer.) The other vias 112 are through-hole vias that do extend to lower (e.g., signal-routing) layers 104. Since the blind micro-vias 110–111 do not extend beyond layers 102 and 103 to/through deeper layers 104, they do not cause routing blockages on those layers 104. And since layers 102 and 103 are typically implemented with conductive planes and not with discrete traces, vias 110–111 also do not cause blockages on those layers 102 and 103. The inventor's observations indicate that this arrangement of PWB 100 on average eliminates the need for 15–25% of traditional through-hole vias, and results in a 25% or more reduction in blockages on layers 104.

The inventor has also recognized that a significant percentage (~10%) of pins on a chip are for static or infrequently-changing signal levels. Such connections are appropriate for being routed via traces on the unshielded surface layers 101. By removing surface layer routing obstructions, more of these static nets can be placed on the surface layers 101, thereby leaving more room for routing on the shielded inner layers 104. This can further reduce routing blockages on the inner layers 104 by up to about 10%.

Figure 2:
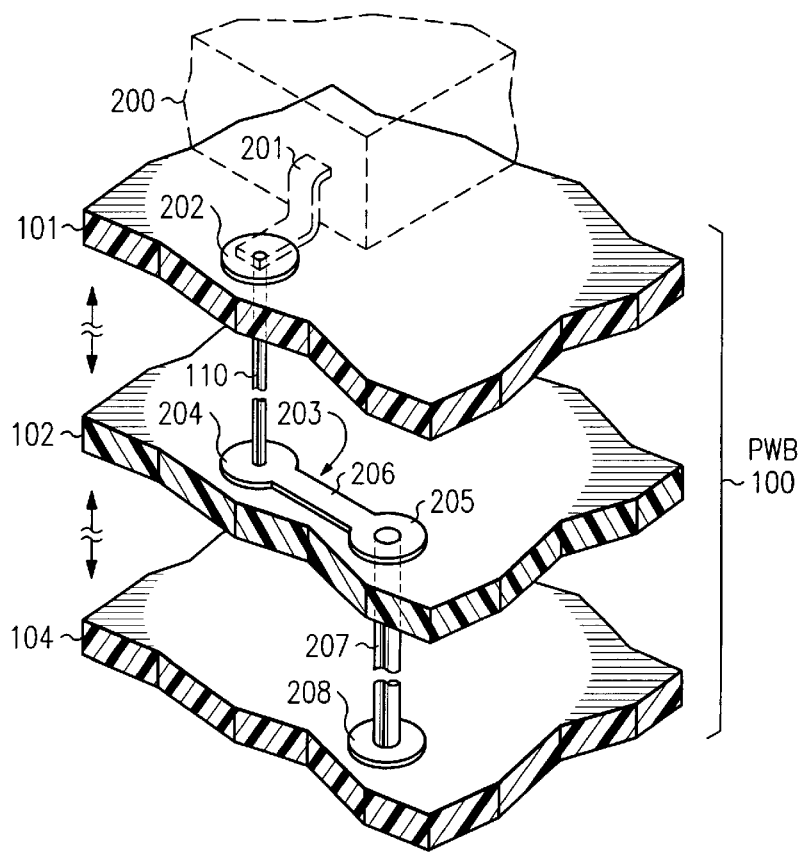
FIG. 2 is an exploded perspective view of a portion of the printed-wiring board of FIG. 1 with insulation layers not shown.

A second aspect of the invention, one example which is shown in FIG. 2, reduces the trace-routing blockages on outer surface layers 101 caused by having separate pads on the surface layers 101 for connecting vias and for connecting leads 201 of components 200. According to this aspect of the invention, common pads 202 are employed on surface layers 101 for connecting both leads 201 and blind micro-vias 110/111. Unlike through-hole vias, however, micro-vias 110/111 are drilled by laser and hence can be made with a small diameter and a shallow depth, thereby ensuring that the micro-vias 110/111 do not wick enough solder away from pads 202 to cause unreliable connections. However, because they are drilled by laser, micro-vias 110/111 generally cannot be drilled very deep; typically, they cannot extend beyond the first or second buried conductive layers 102 or 103. Consequently, pads 202 cannot be connected to deeper conductive layers 104 (e.g., signaling layers) directly by micro-vias 110/111.

This problem is solved by connecting micro-vias 110/111 to buried vias 207 which then effect the connection to layers 104. A buried via 207 is a through-hole via drilled before surface layers 101 are applied to PWB 100 during its manufacture. However, micro-vias 110/111 and buried vias 207 cannot be positioned co-axially, or one on top of each other (referred to as "stacked vias"). The reason is that the via holes would be concentric but of different diameters, and therefore micro-vias 110/111 via would not be conductively connected to buried vias 207 at the point (level) where they meet.

This problem is solved by using the micro-vias 110/111 to connect pads 202, which need to be connected to deeper layers 104, to elongated ("double", "dog-bone", or "dumbbell" shaped) pads 203 formed on the first or second buried conductive layers 102 or 103. A double pad 203 illustratively comprises a pair of adjacent single, normal, pads 204–205 forming separate regions for connecting to micro-vias 110/111 and buried vias 207, interconnected by a short trace 206. Micro-vias 110/111 connect pads 202 to pads 204 of double pads 203. Pads 205 of double pads 203 are then connected to pads 208 on deeper layers 104 of PWB 100 by buried vias 207. Since double pads 203 are thus moved from surface layers 101 to layers 102 and 103, they no longer cause routing blockages on surface layers 101. Since layers 102 and 103 are generally made as conductive sheets as opposed to discrete traces, double pads 203 do not cause routing blockages on layers 102 and 103. And since micro-vias 110/111 connect to different pads 204 than pads 205 to which buried vias 207 connect, the connection problem posed by stacked vias is avoided.

Of course, various changes and modifications to the illustrative embodiment described above will be apparent to those skilled in the art. For example, additional power and ground inner layers may be included in the stackup, that are not directly connected to the pin power and ground micro vias but are intended for inner-layer shielding/microstrip stackups. Also, buried vias may be used which may not span the entire non-surface layer group of layers (102–104). Further, layer-to-layer dielectric or conductive thickness variations designed for particular impedance or capacitive targets may be used. Furthermore, the power and ground layers may be transposed. Also, minor routing of traces may be included on the power or ground planes while leaving the planes largely intact. Such changes and modifications can be made without departing from the spirit and the scope of the invention and without diminishing its attendant advantages. It is therefore intended that such changes and modifications be covered by the following claims.

What is claimed is:

1. A multi-layer printed-wiring board comprising:

an outer surface conductor-bearing layer;

one of a power layer for connection to a power source and a ground layer for connection to ground directly adjacent, without intermediacy of another conductor-bearing layer, to the outer surface layer; and the other of the power layer and the ground layer directly adjacent, without intermediacy of another conductor-bearing layer, to the one layer; wherein the outer surface layer is conductively connected to the one and the other layers by vias that do not extend to any other conductor-bearing layers.

2. The printed-wiring board of claim 1 further comprising:

at least one signal-routing layer for connection to signals adjacent to the other layer and conductively connected to the outer surface layer by vias that extend through the one and the other layer.

3. The printed-wiring board of claim 1 wherein:

the board is adapted to have components mounted on both sides thereof and further comprises
  a second outer surface conductor-bearing layer,
  one of a second power layer for connection to a power source and a second ground layer for connection to ground directly adjacent, without intermediacy of another conductor-bearing layer, to the second outer surface layer,
  the other of the second power layer and the second ground layer directly adjacent, without intermediacy of another conductor-bearing layer, to the one second layer; wherein
  the second outer surface layer is conductively connected to the one and the other second layers by second vias that do not extend to any other conductor-bearing layers.

4. The printed wiring board of claim 3 further comprising:

at least one signal-routing layer for connection to signals positioned between the other layer and the other second layer, conductively connected to at least one of the outer surface layers by vias that extend through the power layers and the ground layers.

5. The printed-wiring board of claim 1 wherein:

the outer surface layer includes signal-routing traces for static and infrequently-changing signals.

6. The printed-wiring board of claim 1 further comprising:

at least one signal-routing inner layer for connection to signals including signal-routing traces; wherein the outer surface layer has pads for effecting connections thereto, at least one of the power layer and the ground layer includes elongated pads each having a first region and a second region separate from the first region, each elongated pad corresponding to a different one of the outer surface pads, the outer surface layer includes conductive micro-vias each extending between and connecting a different one of the outer surface pads to the first region of a corresponding one of the elongated pads, the micro-vias not extending to any other conductor-bearing layers, and the at least one of the power layer and the ground layer includes conductive buried vias extending between and connecting the second regions of the plurality of elongated pads to the signal-routing traces of the at least one inner layer, the buried vias not extending to the outer surface layer.

7. The printed wiring board of claim 6 wherein:

each elongated pad comprises a pair of adjacent and conductively interconnected single pads, one of the single pads forming the first region and another of the single pads forming the second region.

8. The printed-wiring board of claim 6 wherein:

the outer surface layer includes signal-routing traces for static and infrequently-changing signals.

9. A multi-layer printed-wiring board comprising:

an outer surface conductor-bearing layer including pads for effecting connections thereto;

one of a power layer for connection to a power supply and a ground layer for connection to ground being a first inner conductor-bearing layer adjacent to the outer surface layer and including elongated pads having a first region and a second region separate from the first region, each elongated pad corresponding to a different one of the outer surface pads;

at least one second conductor-bearing inner layer including signal-routing traces;

the outer surface layer including conductive micro-vias each extending between and connecting a different one of the outer surface pads to the first region of the corresponding elongated pad, the micro-vias not extending to inner conductor-bearing layers beyond the first inner layer; and the inner layers including conductive buried vias extending between and connecting the second regions of the elongated pads to the signal-routing traces, the buried vias not extending to the outer surface layer.

10. The printed wiring board of claim 9 wherein:

each elongated pad comprises a pair of adjacent and conductively interconnected single pads, one of the single pads forming the first region and another of the single pads forming the second region.

11. The printed-wiring board of claim 9 wherein:

the first inner layer comprises
  one of a power layer for connection to a power source and a ground layer for connection to ground directly adjacent, without intermediacy of another conductor-bearing layer, to the outer surface layer, and
  the other of the power layer and the ground layer directly adjacent, without intermediacy of another conductor-bearing layer, to the one layer,
  at least one of the one and the other layers including the elongated pads.

12. The printed-wiring board of claim 11 wherein:

the at least one second inner layer is conductively connected to the outer surface layer by vias that extend through the first inner layer.

13. The printed-wiring board of claim 11 wherein:

the outer surface layer includes signal-routing traces for static and infrequently-changing signals.

14. The printed-wiring board of claim 11 wherein:

the board is adapted to have components mounted on both sides thereof and further comprises
  a second outer surface conductor-bearing layer,
  one of a second power layer for connection to a power source and a second ground layer for connection to ground directly adjacent, without intermediacy of another conductor-bearing layer, to the second outer surface layer,
  the other of the second power layer and the second ground layer directly adjacent, without intermediacy of another conductor-bearing layer, to the one second layer; wherein
  the second outer surface layer is conductively connected to the one and the other second layers by second vias that do not extend to any other conductor-bearing layers.

* * * * *